(12) United States Patent
Chen et al.

(10) Patent No.: US 8,501,587 B2
(45) Date of Patent: Aug. 6, 2013

(54) STACKED INTEGRATED CHIPS AND METHODS OF FABRICATION THEREOF

(75) Inventors: Ming-Fa Chen, Taichung (TW); Jao Sheng Huang, Jiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 730 days.

(21) Appl. No.: 12/613,408

(22) Filed: Nov. 5, 2009

(65) Prior Publication Data
US 2010/0178761 A1 Jul. 15, 2010

Related U.S. Application Data

(60) Provisional application No. 61/144,389, filed on Jan. 13, 2009.

(51) Int. Cl.
*H01L 21/467* (2006.01)
*H01L 21/441* (2006.01)

(52) U.S. Cl.
USPC ........... 438/459; 438/613; 438/667; 257/698; 257/E21.585; 257/E21.57; 257/E23.011

(58) Field of Classification Search
USPC .. 438/455, 613, 667, 672, 675, 459; 257/698, 257/E21.585, E21.597, E23.011
See application file for complete search history.

(56) References Cited

U.S. PATENT DOCUMENTS

| | | | |
|---|---|---|---|
| 5,391,917 A | 2/1995 | Gilmour et al. | |
| 5,424,245 A | 6/1995 | Gurtler et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,355,501 B1 | 3/2002 | Fung et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,734,084 B1* | 5/2004 | Nemoto et al. | 438/466 |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,897,125 B2 | 5/2005 | Morrow et al. | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |

(Continued)

*Primary Examiner* — Zandra Smith
*Assistant Examiner* — Toniae Thomas
(74) *Attorney, Agent, or Firm* — Slater & Matsil, L.L.P.

(57) ABSTRACT

Structure and methods of forming stacked semiconductor chips are described. In one embodiment, a method of forming a semiconductor chip includes forming an opening for a through substrate via from a top surface of a first substrate. The sidewalls of the opening are lined with an insulating liner and the opened filled with a conductive fill material. The first substrate is etched from an opposite bottom surface to form a protrusion, the protrusion being covered with the insulating liner. A resist layer is deposited around the protrusion to expose a portion of the insulating liner. The exposed insulating liner is etched to form a sidewall spacer along the protrusion.

20 Claims, 20 Drawing Sheets

U.S. PATENT DOCUMENTS

| | | |
|---|---|---|
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,241,675 B2 | 7/2007 | Savastiouk et al. |
| 7,262,495 B2 | 8/2007 | Chen et al. |
| 7,282,444 B2 * | 10/2007 | Tanida et al. ............ 438/667 |
| 7,297,574 B2 | 11/2007 | Thomas et al. |
| 7,335,972 B2 | 2/2008 | Chanchani |
| 7,355,273 B2 | 4/2008 | Jackson et al. |
| 7,361,532 B2 * | 4/2008 | Fukazawa ............ 438/113 |
| 7,691,747 B2 * | 4/2010 | Lin et al. ............ 438/667 |
| 2002/0084513 A1 | 7/2002 | Siniaguine |
| 2003/0173678 A1 * | 9/2003 | Mizukoshi ............ 257/774 |
| 2004/0256737 A1 * | 12/2004 | Huang et al. ............ 257/778 |
| 2005/0136568 A1 * | 6/2005 | Fukazawa ............ 438/106 |
| 2005/0179120 A1 * | 8/2005 | Yamaguchi ............ 257/666 |
| 2005/0230805 A1 * | 10/2005 | Miyazawa ............ 257/690 |
| 2006/0214302 A1 * | 9/2006 | Matsuo ............ 257/758 |
| 2007/0032061 A1 * | 2/2007 | Farnworth et al. ............ 438/597 |
| 2007/0045836 A1 * | 3/2007 | Kwon et al. ............ 257/734 |
| 2007/0048969 A1 * | 3/2007 | Kwon et al. ............ 438/455 |
| 2007/0111386 A1 | 5/2007 | Kim et al. |
| 2008/0157287 A1 * | 7/2008 | Choi et al. ............ 257/621 |
| 2010/0038800 A1 * | 2/2010 | Yoon et al. ............ 257/774 |
| 2010/0176494 A1 * | 7/2010 | Chen ............ 257/621 |
| 2011/0165776 A1 * | 7/2011 | Hsu et al. ............ 438/667 |

* cited by examiner

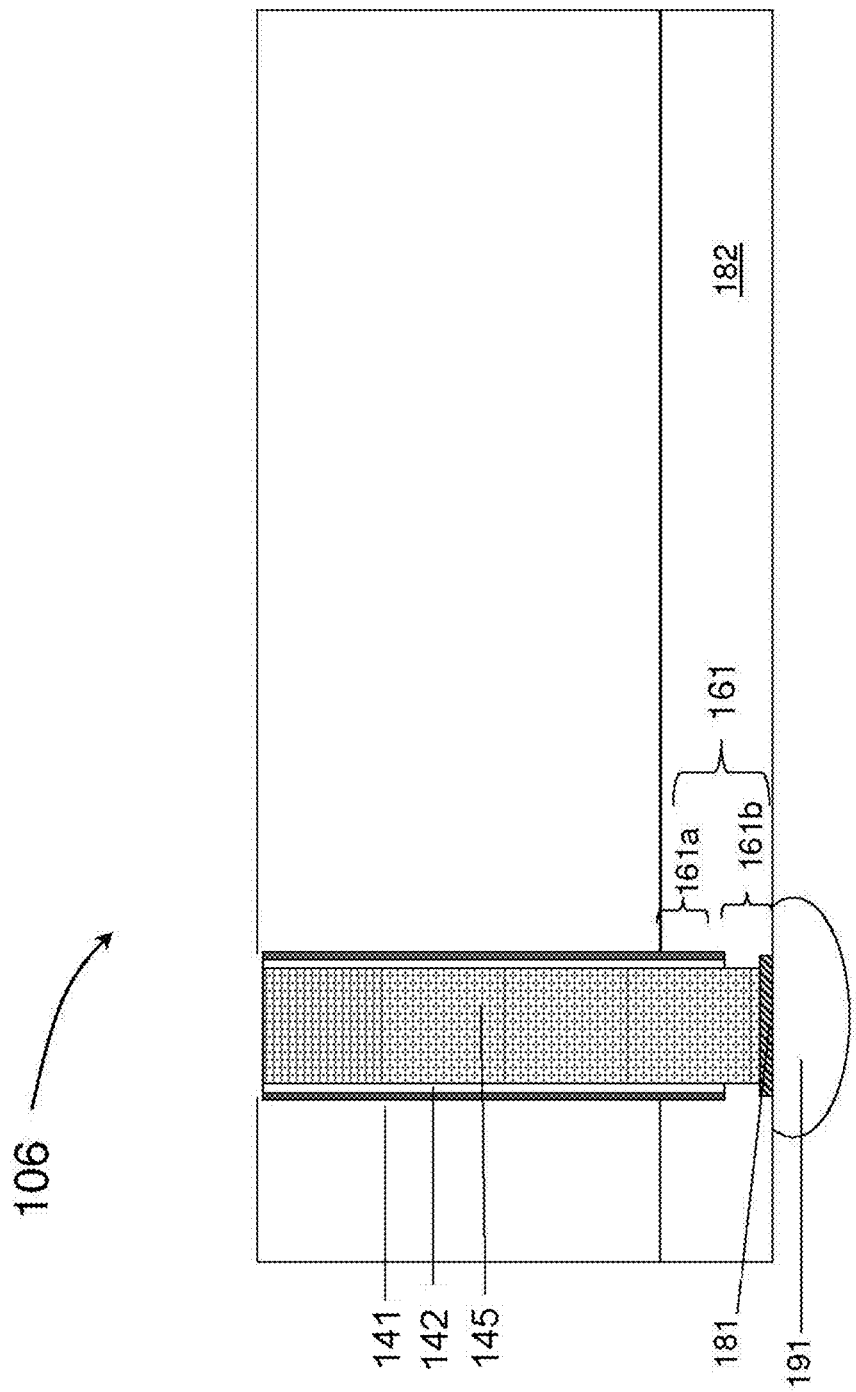

STACKED INTEGRATED CHIPS AND METHODS OF FABRICATION THEREOF

This application claims the benefit of U.S. Provisional Application No. 61/144,389 filed on Jan. 13, 2009, entitled "Stacked Integrated Chips and Methods of Fabrication Thereof," which application is hereby incorporated herein by reference.

TECHNICAL FIELD

The present invention relates generally to integrated chips, and more particularly to stacked integrated chips and methods of fabrication of stacked integrated chips.

BACKGROUND

Semiconductor devices are manufactured by forming active regions in a semiconductor substrate, depositing various insulating, conductive, and semiconductive layers over the substrate, and patterning them in sequential steps. The upper or last-formed layers of the semiconductor device typically comprise metallization layers. The metallization layers typically comprise one or more layers of metal interconnect having conductive lines disposed within an insulating material and may provide connections to underlying active regions and connections within and over the substrate. Integrated circuit chips may be attached to a lead frame and then packaged in a ceramic or plastic carrier.

As the cost of shrinking semiconductor devices continues to increase, however, alternative approaches, such as extending the integration of circuits into the third dimension or semiconductor substrate stacking are being explored. Two or more substrates are bonded together to form a three-dimensional structure. The active circuitry of the stacked substrates are coupled through one or more through substrate vias.

However, three-dimensional integration introduces many challenges to fabrication. One of the challenges in three-dimensional integration involves forming joints between the stacked substrates without forming additional shorts or leakage paths.

The through substrate vias used for coupling the substrates are insulated from the substrate by a dielectric layer. However, an electrical short between the underlying substrate and the through substrate via, for example, formed during the joint formation process can result in deleterious process yield and is hence undesirable.

Hence, what are needed are cost efficient means of stacking semiconductor substrates without compromising on process yield.

SUMMARY OF THE INVENTION

These and other problems are generally solved or circumvented, and technical advantages are generally achieved, by preferred embodiments of the present invention.

Embodiments of the invention include stacked semiconductor chips. In accordance with a preferred embodiment of the present invention, a method of forming a semiconductor chip comprises forming an opening for a through substrate via from a top surface of a first substrate, and lining sidewalls of the opening with an insulating liner. The method further comprises filling the opening with a conductive fill material, and etching the first substrate from an opposite bottom surface to form a protrusion, the protrusion being covered with the insulating liner. A resist layer is then deposited around the protrusion to expose a portion of the insulating liner. The exposed insulating liner is etched to form a sidewall spacer along the protrusion.

The foregoing has outlined, rather broadly, the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes

FIG. 2, which includes FIG. 3, which includes FIGS. 3a and 3b, illustrates a stacked integrated circuit formed using embodiments of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The through substrate vias are insulated from the substrate by a dielectric layer. A through substrate via from one chip is joined to a suitable landing pad or an under bump structure of another substrate using, for example, solder balls. However, some of the conductive materials used in the joining process may form a conductive string between the joint and the substrate thus electrically coupling the through substrate via to the substrate. In various embodiments, the invention avoids this electrical shorting by the use of a sidewall spacer that only exposes a portion of the through substrate via during joint formation, and hence inhibits the formation of an electrical string between the substrate and the joint.

FIGS. 1 and 2 illustrate embodiments of forming stacked integrated chips, while FIG. 3 illustrates a stacked integrated chip.

FIG. 1, which includes FIGS. 1a-1m, illustrates a stacked integrated chip comprising through substrate via during fabrication, in accordance with an embodiment of the invention.

Figure 1A:
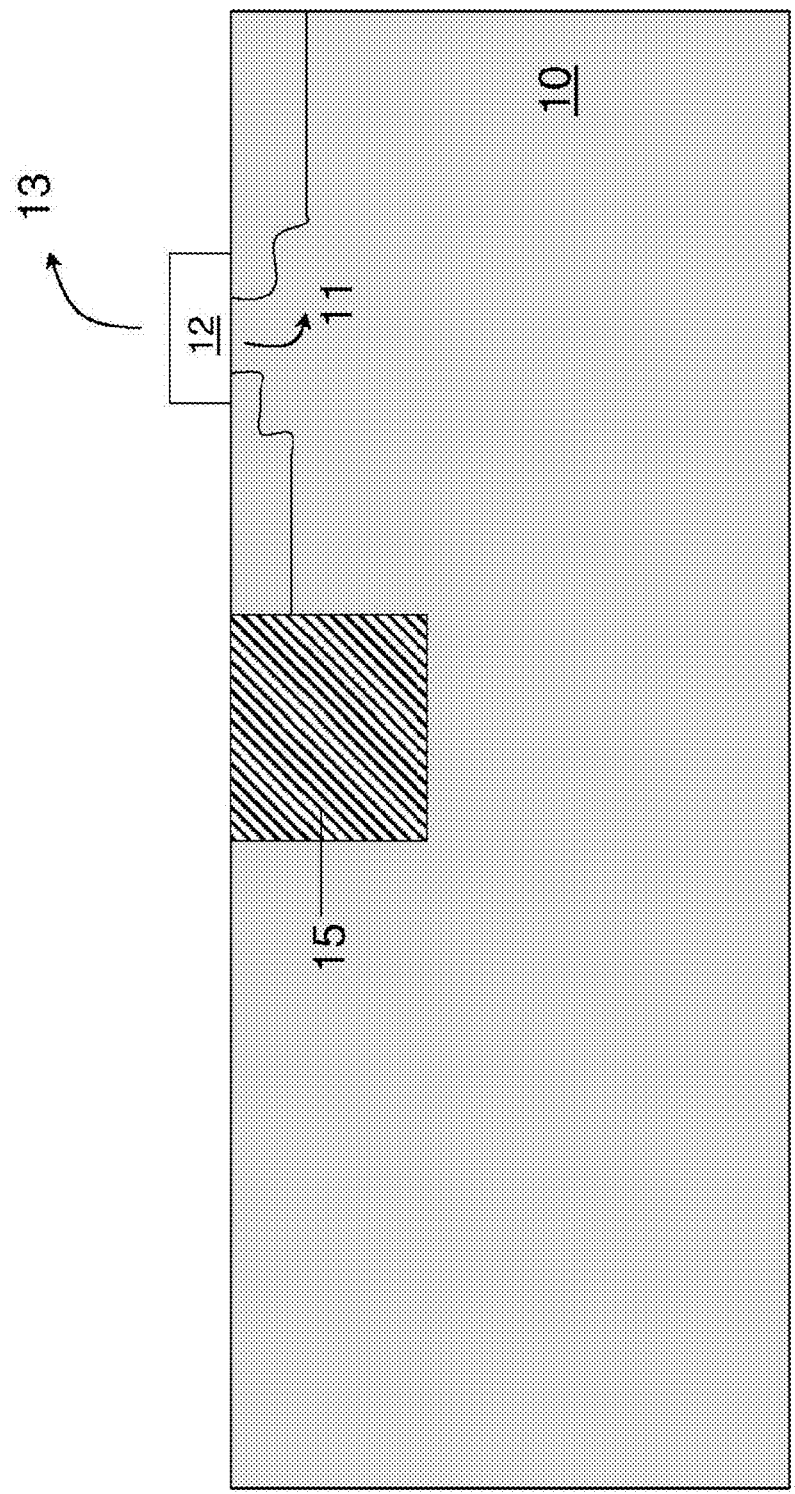
FIGS. 1a-1m, illustrates a stacked integrated chip comprising through substrate vias during fabrication, in accordance with an embodiment of the invention.

Referring to FIG. 1a, active device regions 11 are formed on a side near a top surface of a substrate 10 during front end processing. The substrate 10 is typically a semiconductor wafer. The active device regions 11 or active circuitry can include transistors, resistors, capacitors, inductors or other components used to form integrated circuits. For example, active areas that include transistors (e.g., CMOS transistors) can be separated from one another by isolation regions, e.g., shallow trench isolation. In an alternative embodiment, the active device regions 11 comprise bipolar transistors.

Referring to FIG. 1a, examples of the substrate 10 include a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In other embodiments other semiconductors, such as silicon germanium, germanium, gallium arsenide, indium arsenide, indium gallium arsenide, indium antimonide or others, can be used with the wafer.

Isolation trenches are formed in the substrate 10. Conventional techniques may be used to form the isolation trenches. For example, a hard mask layer (not shown here), such as silicon nitride, can be formed over the substrate 10 and patterned to expose the isolation areas. The exposed portions of the substrate 10 can then be etched to the appropriate depth, which is typically between about 200 nm and about 400 nm. The isolation trenches are filled with an isolating material thereby forming shallow trench isolation 15. Gate dielectrics are deposited followed by the formation of a gate stack 12. The gate stack 12 comprises a semiconductor material, such as polysilicon or metallic or silicide materials. The source/drain extensions, source/drain, and channel regions are doped with implant and anneal processes to form the transistors 13.

Next, metallization is formed over the active device regions 11 to electrically contact and interconnect the active device regions 11. The metallization and active circuitry together form a completed functional integrated circuit. In other words, the electrical functions of the chip can be performed by the interconnected active circuitry. In logic devices, the metallization may include many layers, e.g., nine or more, of copper. In memory devices, such as DRAMs, the number of metal levels may be less and may be aluminum.

The components formed during the front-end processing are interconnected by back end of line (BEOL) processing. During this process, contacts are made to the semiconductor body and interconnected using metal lines and vias. As discussed above, modern integrated circuits incorporate many layers of vertically stacked metal lines and vias (multilevel metallization) that interconnect the various components in the chip.

Figure 1B:
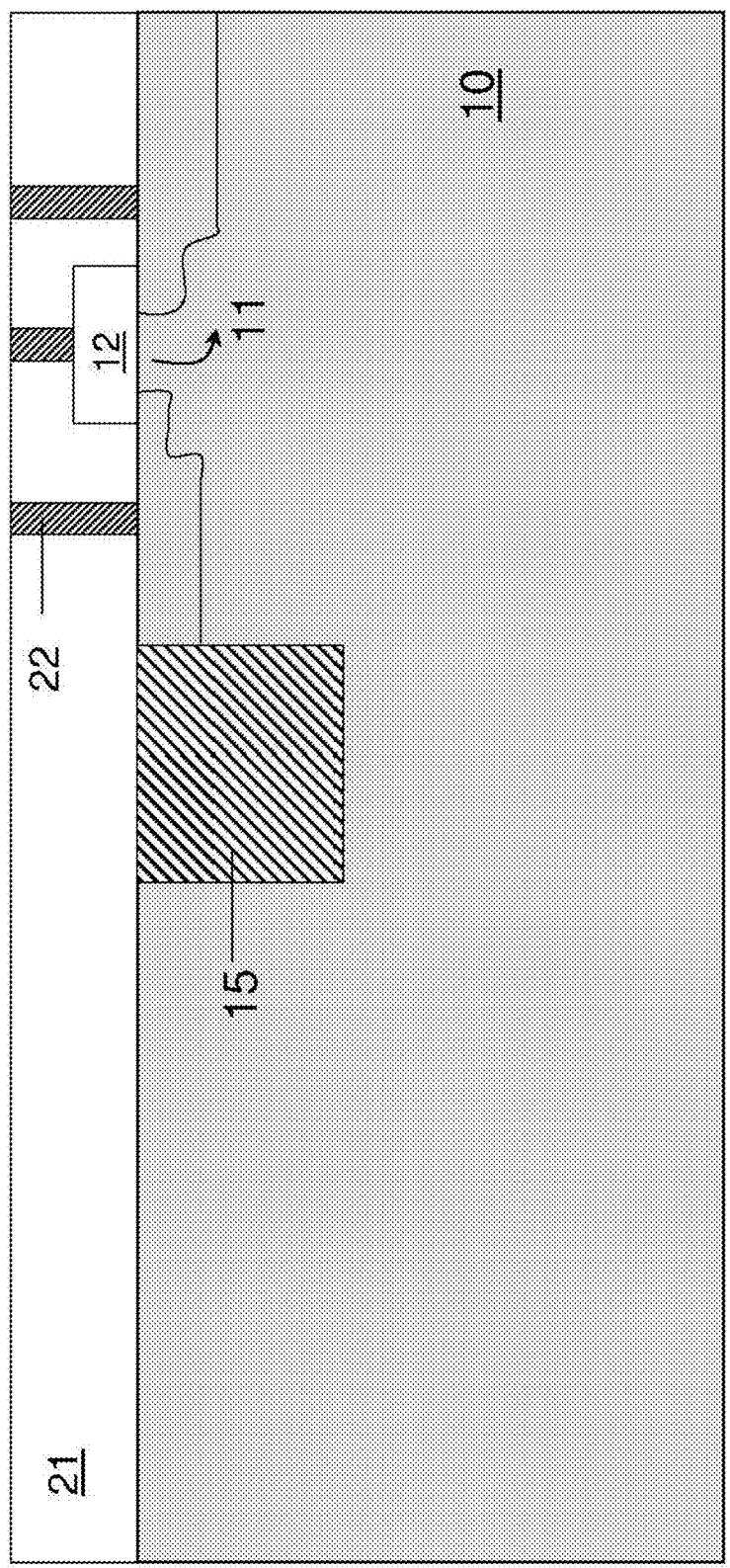

Referring now to FIG. 1b, a first insulating material layer 21 is formed over an etch stop liner. The etch stop liner is deposited over the substrate 10 before depositing the first insulating material layer 21 to also protect the underlying substrate during contact plug formation. For example, a nitride film (e.g., silicon nitride) is deposited as an etch stop liner.

The insulating material layer 21 preferably comprises insulating materials typically used in semiconductor manufacturing for inter-level dielectric (ILD) layers, such as $SiO_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON. The ILD may also comprise suitable low k or ultra-low k (ULK) materials. The ILD may comprise a thickness of about 500 nm or less, for example, although alternatively, the ILD may comprise other dimensions.

In regions with substrate contact plugs, the first insulating material layer 21 and the etch stop liner are patterned and etched. The substrate contact plugs 22 are made of a multilayer structure comprising a first conductive liner (e.g. CVD titanium nitride and silicon doped tungsten) and a first conductive material (e.g. tungsten).

Figure 1C:
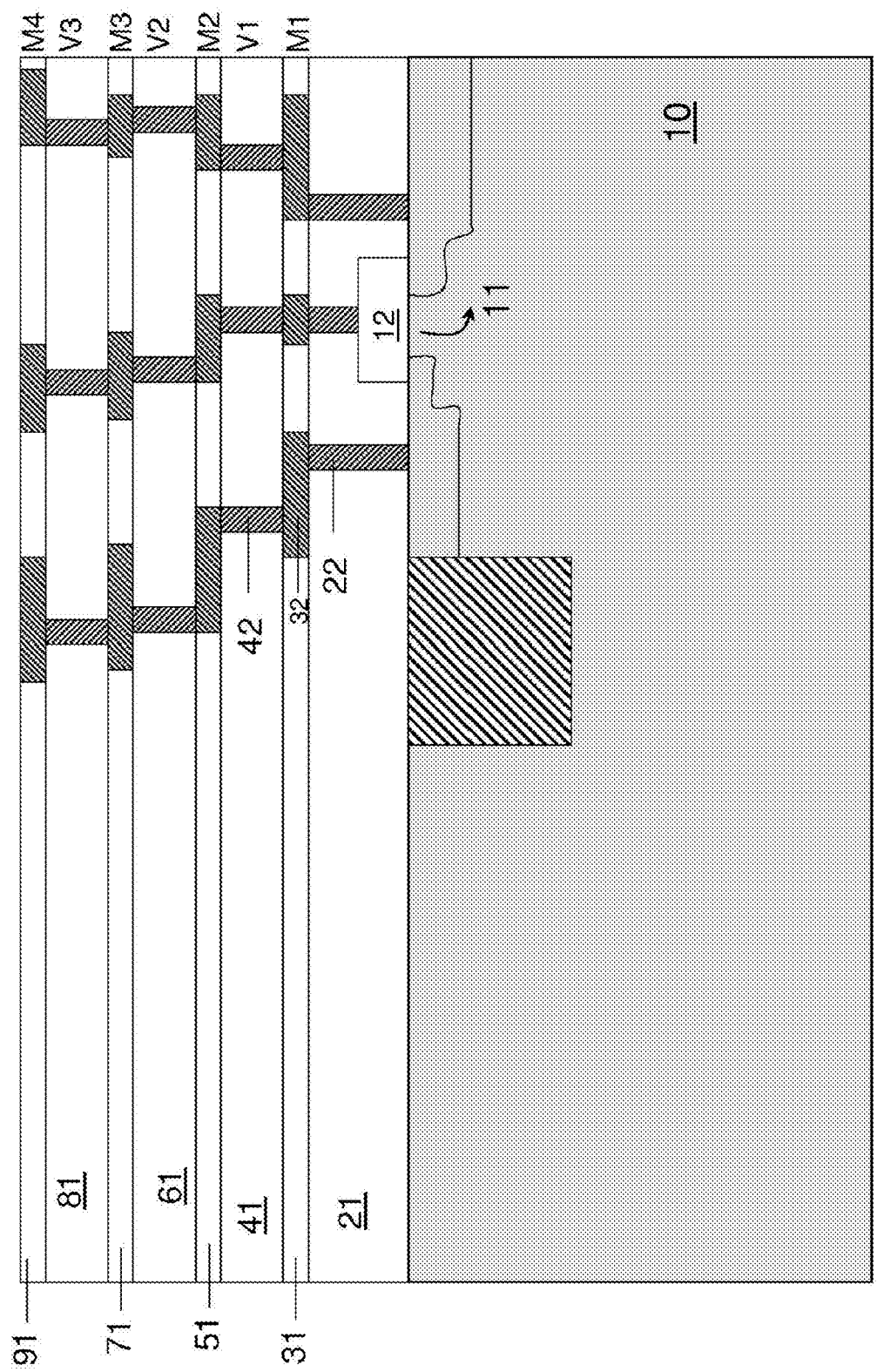

Referring now to FIG. 1c, a second insulating material layer 31 is then deposited over the first insulating material layer 21. The second insulating material layer 31 preferably comprises a low-k dielectric material having a dielectric constant of 3.6 or less, and may require heating, e.g., up to 400 degrees C. to remove solvents. The second insulating material layer 31 is patterned via lithography, e.g., with a mask. A photoresist is deposited over the second insulating material layer 31, and portions of the photoresist are exposed, developed and removed, leaving a pattern for a metal line. The exposed second insulating material layer 31 is removed to form opening in the second insulating material layer 31.

A second conductive liner is preferably deposited using a conformal deposition process, leaving a conformal liner or diffusion barrier along the interior walls of opening. Preferably the second conductive liner comprises tantalum nitride deposited by plasma vapor deposition (PVD). Alternatively, the second conductive liner may comprise titanium nitride, tungsten nitride, a refractory metal or other barrier layers that may be conformally deposited, for example, using CVD, PVD processes or electro-less plating. The second conductive liner may comprise a bi-layer of material, including, for example, a barrier layer and a conformal seed layer, which preferably comprises copper, aluminum, other metals or combinations thereof. The seed layer may be deposited using a CVD process, for example.

The remainder of the opening is filled with a second conductive material 32, for example, using an electroplated fill process to form a first metal line level (M1) having a portion residing within the second insulating material layer 31 and a portion residing over the first insulating material layer 21. The second conductive material 32 preferably comprises copper, aluminum or other metals or combinations thereof.

A third insulating material layer 41 is deposited over the second insulating material layer 31. The third insulating material layer 41 is patterned and etched to create via holes. The via holes are filled with a third conductive material 42 such as copper to form first via level (V1). Similarly, more number of metal line levels and via levels are formed above the first via level (V1). For example, in FIG. 1c, fourth, fifth, sixth, seventh, and eighth insulating material layers 51, 61, 71, 81, and 91 comprising second metal line level (M2), second via level (V2), third metal line level (M3), third via level (V3), and fourth metal line level (M4) are formed. Further levels of metal lines $M_2$, $M_3$, $M_4$, etc and via levels $V_2$, $V_3$, etc. could proceed as discussed above by repeating the process for formation of metal lines and vias.

Figure 1D:
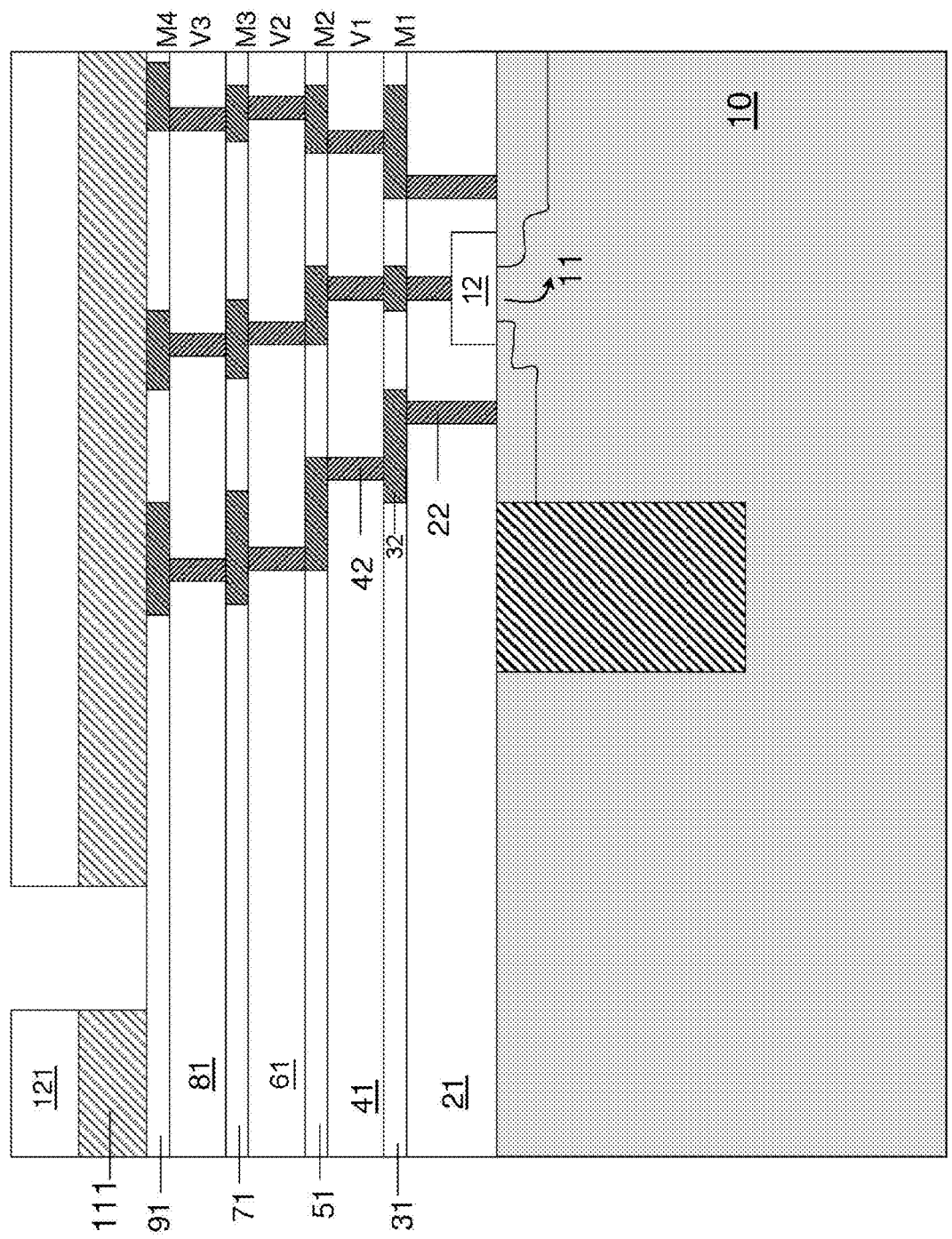

As illustrated in FIG. 1d, a passivation layer 111 is deposited over the last metal line (fourth metal line level M4). The passivation layer 111 is an insulating layer and typically comprises an oxide layer or an oxide/nitride layer stack. In other embodiments, the passivation layer 111 may comprise silicon nitride, or silicon oxynitride, FTEOS, SiCOH, or combinations thereof with polyimide, photoimide, BCB or other organic polymers. An optional insulating liner is disposed above the passivation layer 111. The optional insulating liner comprises a nitride layer, in one embodiment. In various embodiments, the optional insulating liner may comprise FTEOS, $SiO_2$, SiCOH, or other low-k materials.

A hard mask layer 121 is formed over the passivation layer 111 (FIG. 1*d*). In various embodiments, the hard mask layer 121 is coated, for example, by a spin-on process or applied using a chemical vapor deposition process. In various embodiments, the hard mask layer 121 comprises a nitride, organic polymer, BCB, polyimide, photoimide or inorganic dielectric.

In some embodiments, the hard mask layer 121 is also photo sensitive and can be directly exposed using photolithography. Examples of photo-sensitive hard mask layer 121 include photo-sensitive polyimides that can be directly developed. In case of a non-photo-sensitive polyimide, a photo resist is deposited. Using a photolithography process, the hard mask layer 121 and the passivation layer 111 are patterned to form a pattern for forming through substrate vias (FIG. 1*d*).

Figure 1E:
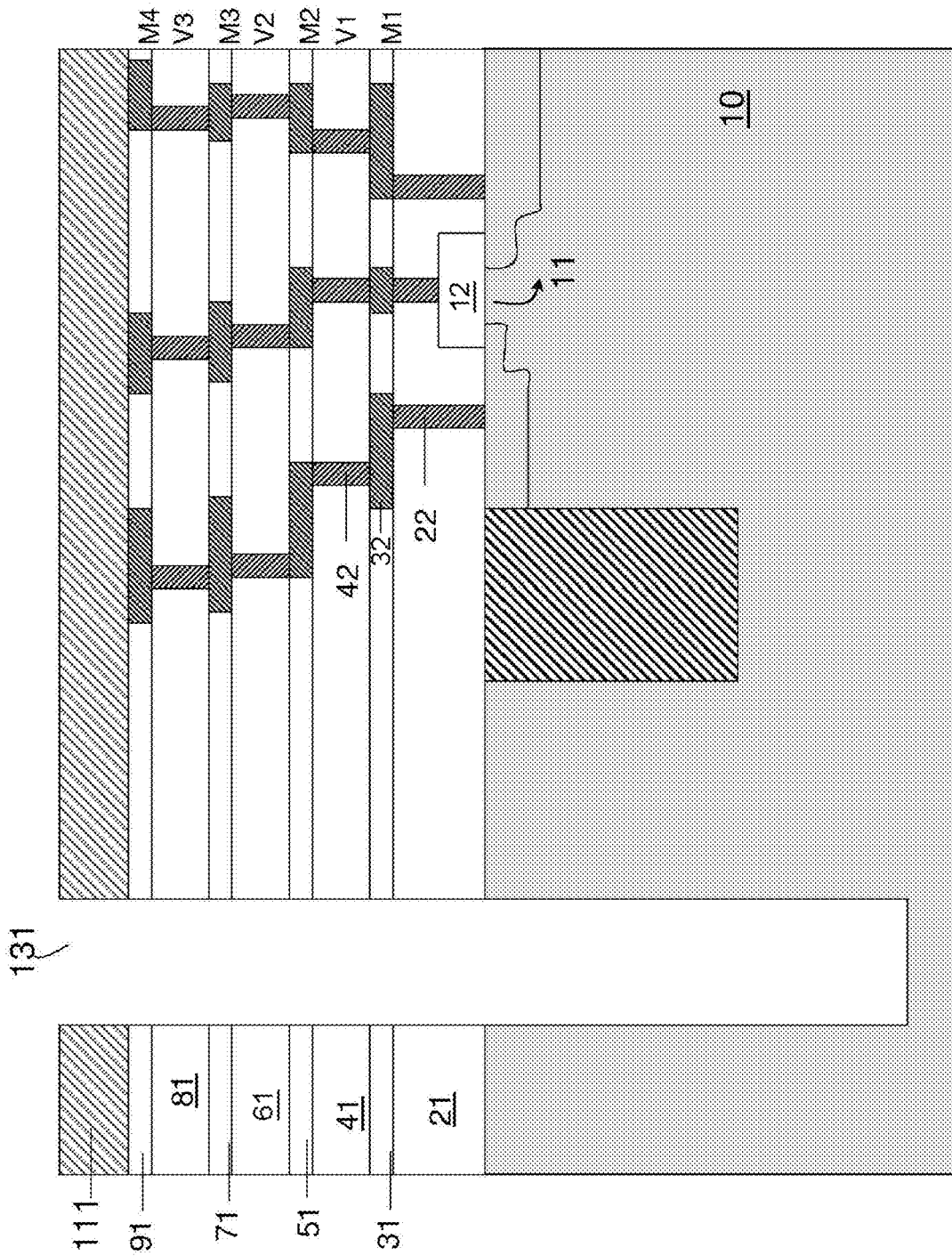

Using the patterned hard mask layer 121, the metallization levels and substrate 10 are etched, as shown in FIG. 1*e*, to form a through substrate via (TSV) opening 131. In various embodiments, multiple etch chemistries may be used to etch through the various insulating layers (which may comprise different materials).

Referring again to FIG. 1*e*, a high density plasma process in an RF plasma chamber is used to form the TSV opening 131. In one embodiment, a highly anisotropic etch is used to form a TSV opening 131. In other embodiments, other types of etch processes may be used, including processes using simultaneous bottom etch and sidewall passivation.

In one embodiment, an etch step is carried out using a fluorine based plasma. However, fluorine based etches are isotropic and result in non vertical trench sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ions. The through substrate opening etch process is carried out in sequential etch and deposition steps. A vertical trench may thus be produced. For example, the fluorine etch step may comprise an $SF_6$ etchant, whereas the polymer producing gas may comprise $C_4F_8$. The etch and deposit steps may be repeated many times, e.g., about 100 times to about 500 times, to form the TSV opening 131. In other embodiments, other types of reaction ion etch processes may be used.

The top of the TSV opening 131 comprises a width of about 2 μm to about 20 μm. The TSV opening 131 thus produced comprises a high aspect ratio opening in the range from about 1:3 to about 1:30 (ratio of width to depth).

Figure 1F:
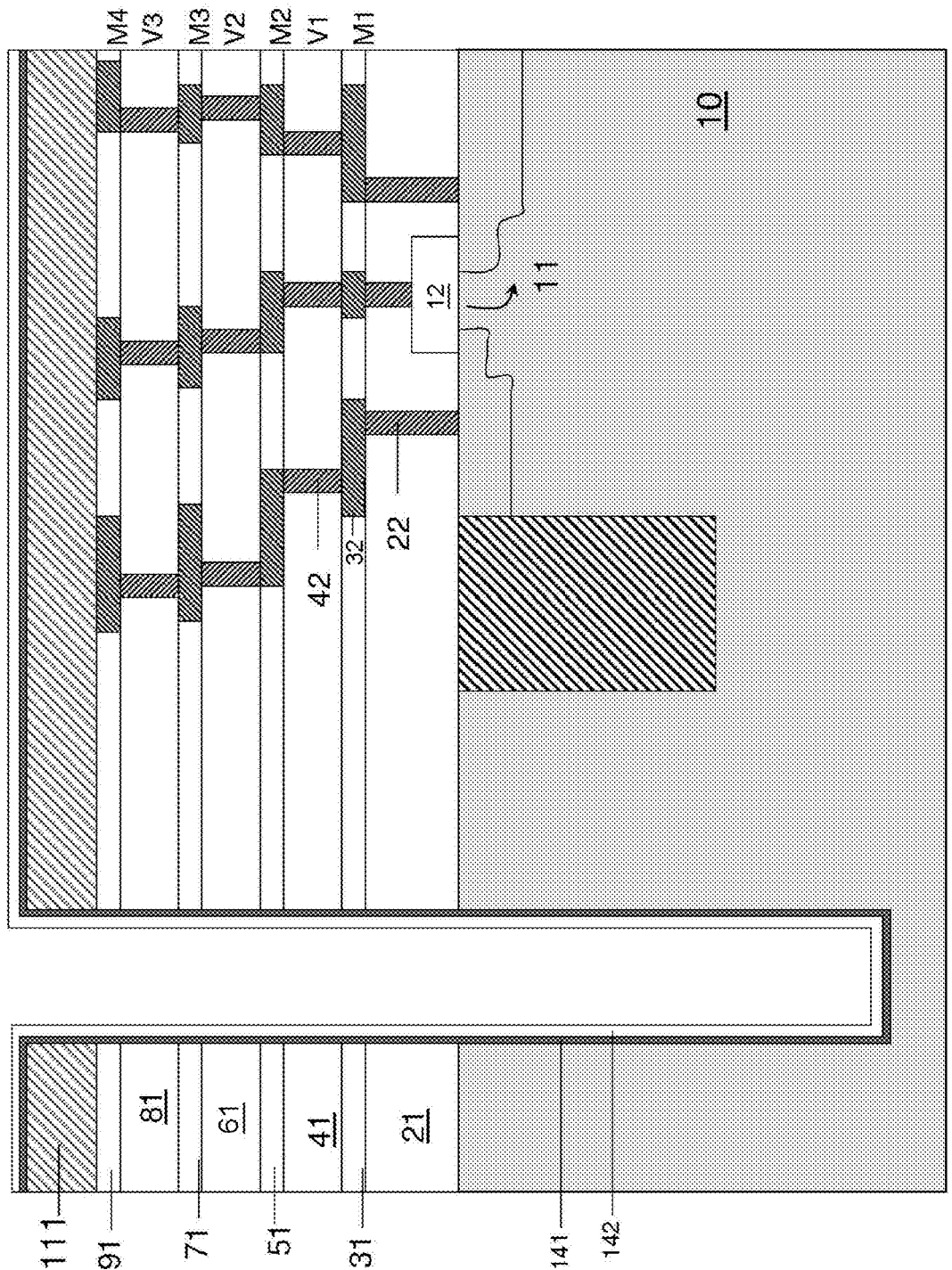

As next illustrated in FIG. 1*f*, the TSV opening 131 is lined with an insulating liner 141, which is formed on the sidewalls of the TSV opening 131. The insulating liner 141 electrically insulates the active device regions 11 from the through substrate via (to be formed). The insulating liner 141 may comprise silicon oxide, silicon nitride, silicon oxynitride, SiC, SiCN, a dense or porous low k or ultra low k dielectric material, an organic material or polymere like parylene, BCB, SiLK or others. In some embodiments, the insulating liner 141 is anisotropically etched forming a sidewall spacer.

As illustrated in FIG. 1*f*, a trench liner 142 is deposited on the insulating liner 141. A trench liner 142 comprising one or multiple metal liners is deposited over the insulating liner 141. The trench liner 142 is at least continuously deposited over the insulating liner 141, and ideally conformal. The trench liner 142 may comprise a single layer or multiple layers. In various embodiments, the trench liner 142 comprises Ta, TaN, W, WN, WCN, WSi, Ti, TiN, Ru, Cu, and combinations thereof. The trench liner 142 is used in some embodiments as a barrier layer for preventing metal from diffusing into the underlying substrate 10 and the insulating liner 141.

The trench liner 142 metal liner is formed using a chemical vapor deposition process, a plasma enhanced CVD process, a plasma vapor deposition process, or a combination of both, although in other embodiments other processes may be used.

The trench liner 142 comprises a Ti/TiN layer or Ta/TaN layer and a copper seed layer. For example, a 5-30 nm titanium layer is deposited followed by a deposition of about a 10-100 nm TiN layer, and a 50-1000 nm copper seed layer.

Figure 1G:
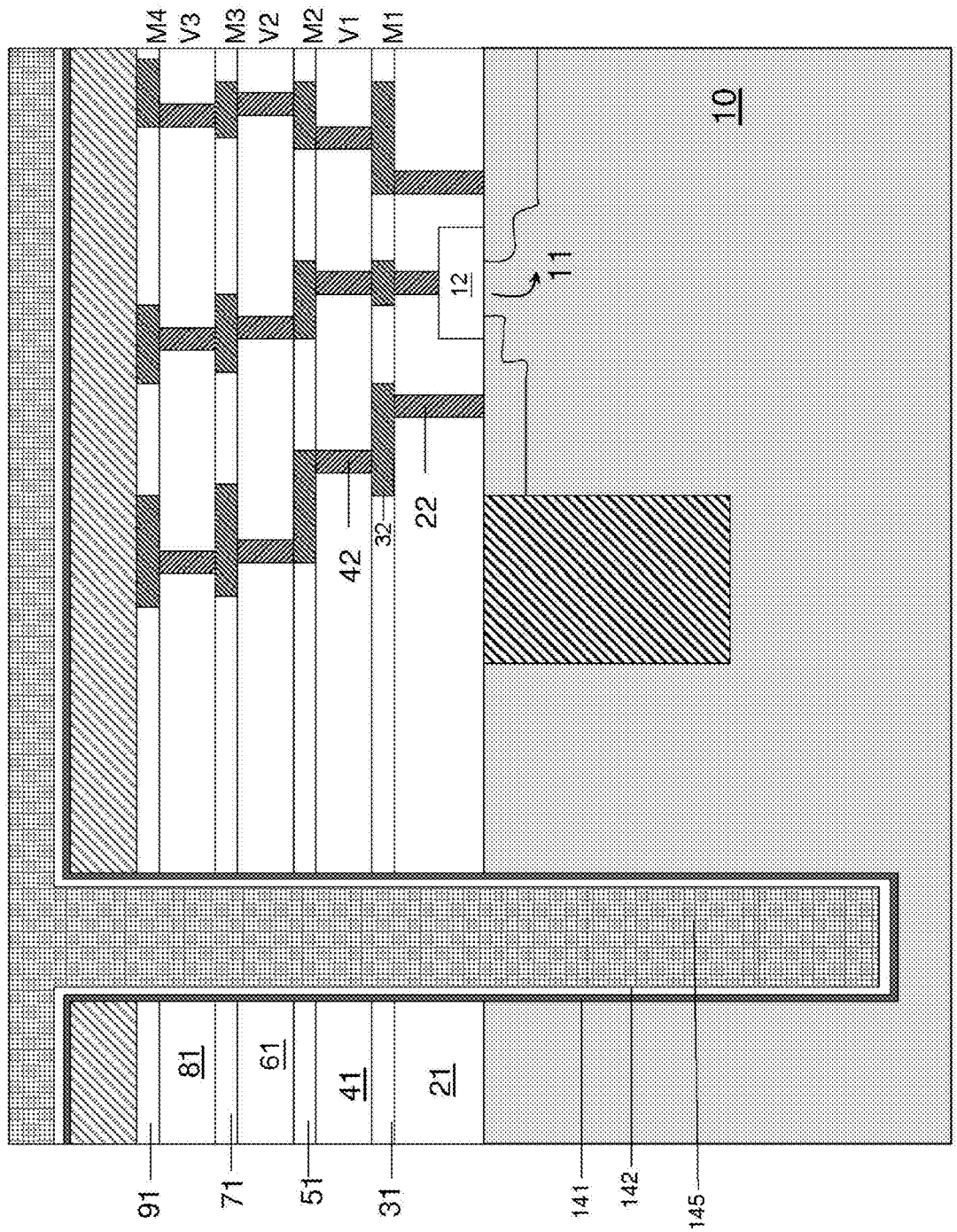

Referring to FIG. 1*g*, a conductive fill material 145 is deposited into the TSV opening 131 and planarized. In various embodiments, the conductive fill material 145 is electroplated over the trench liner 142. The conductive fill material 145 comprises a conductive material, such as copper or alternatively, aluminum, tungsten, silver, gold or doped polysilicon. In various embodiments, the conductive fill material 145 comprises copper. A post chemical mechanical polishing (CMP) clean is next performed to remove any slurry residuals.

Alternatively, the planarization process comprises a CMP. The CMP process removes the conductive fill material 145 and the underlying trench liner 142 from over the passivation layer 111. In various embodiments, the polishing process stops on the insulating liner 141 and/or passivation layer 111. Subsequently, redistribution lines are formed over the passivation layer 111.

Figure 1H:
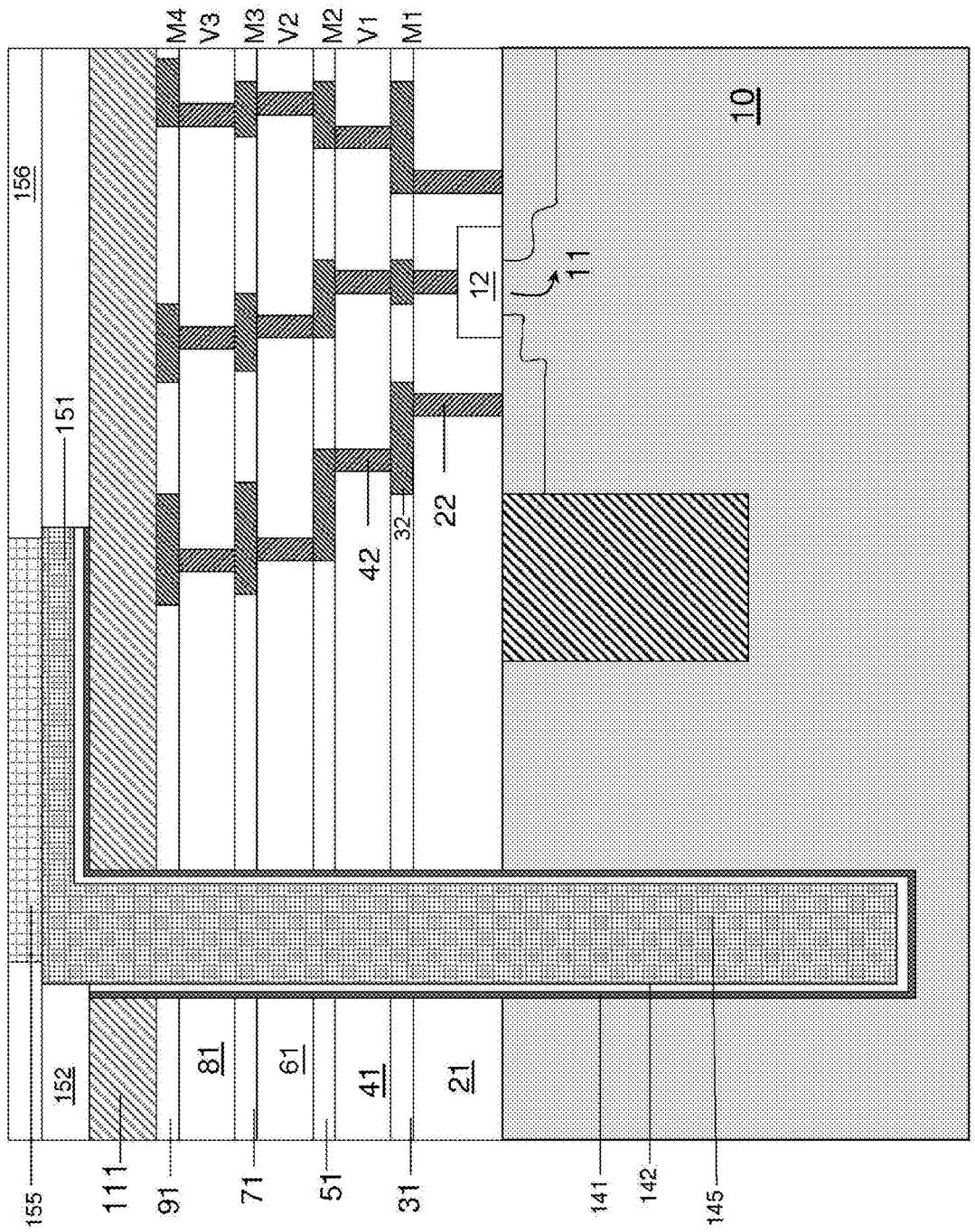

The conductive fill material 145 over the passivation layer 111 is patterned forming bond pads 151 (FIG. 1*h*). Referring to FIG. 1*h*, a tenth insulating material layer 152 is deposited over the passivation layer 111 and planarized. A polyimide material 156, or the like, may then be deposited and patterned forming an under metallization bump (UMB) structure 155. A carrier (not shown) is then attached to the substrate, for example, by depositing an adhesive material layer on the polyimide material 156.

Figure 1I:
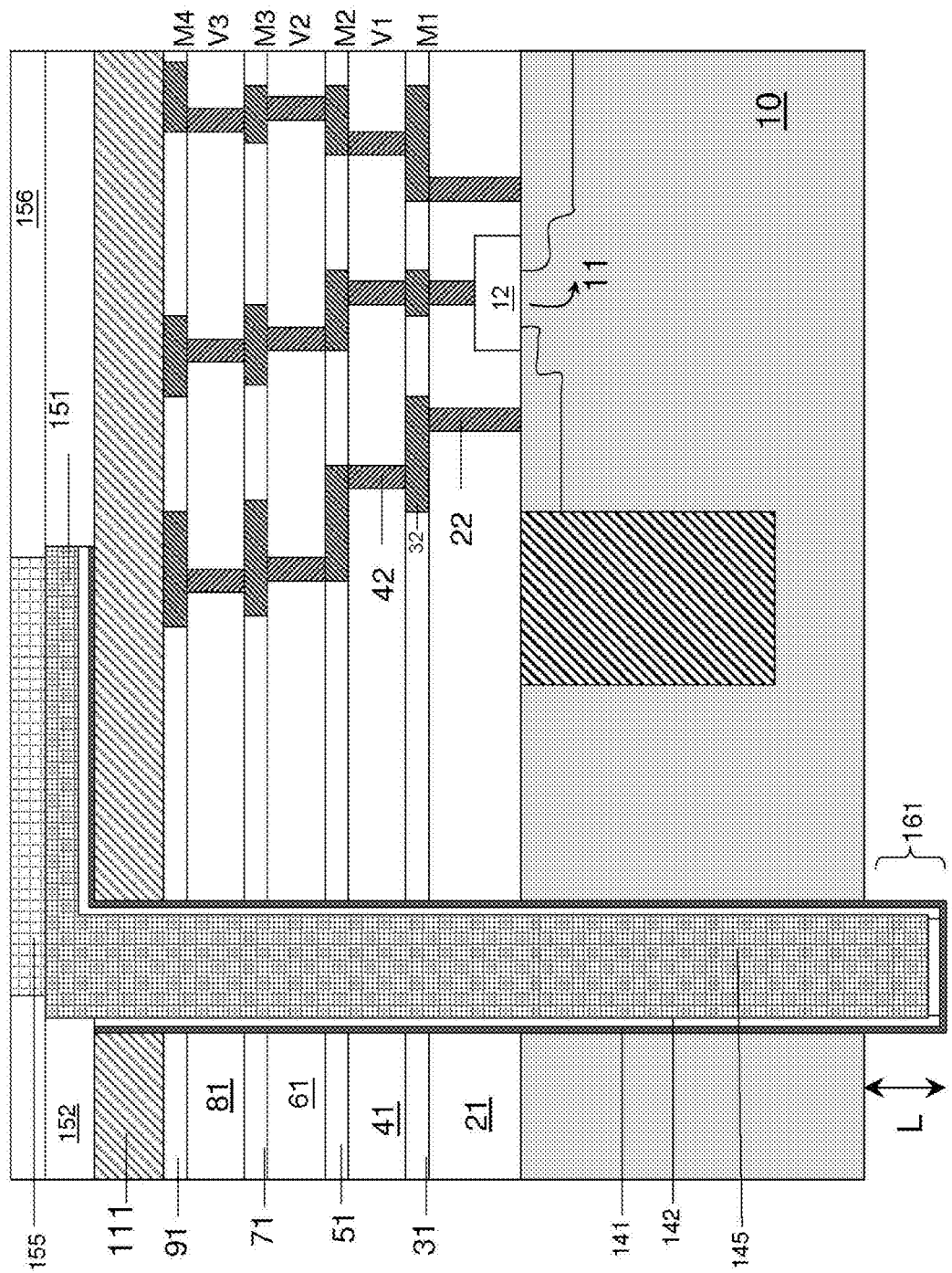

Referring to FIG. 1*i*, the substrate 10 is thinned from the back side, for example, by flipping over and grinding, lapping, polishing, and/or etching processes. The substrate 10 is etched so that a section of the through substrate via 2 is exposed forming a protrusion 161.

A wet etch process preferably used that has a high substrate 10 to insulating liner 141 selectivity. A selectivity of greater than 10:1 may be employed, however, a substrate 10 to insulating liner etch selectivity of greater than 20:1 is preferred. The high selectivity of this wet etch chemistry causes the substrate 10 to etch at a faster rate than the insulating liner 141. Thus, the insulating liner 141 protects the underlying conductive fill material 145 and trench liner 142 also from etching during the wet etch process thus forming a protrusion 161 that protrudes from the substrate 10. In one embodiment, the substrate 10 is etched, for example, using a wet etch chemistry comprising nitric acid, water, acetic acid, and hydrofluoric acid. The protrusion extends to a first distance L from the substrate 10. The first distance L is about 2 um to about 35 um in various embodiments.

Figure 1J:
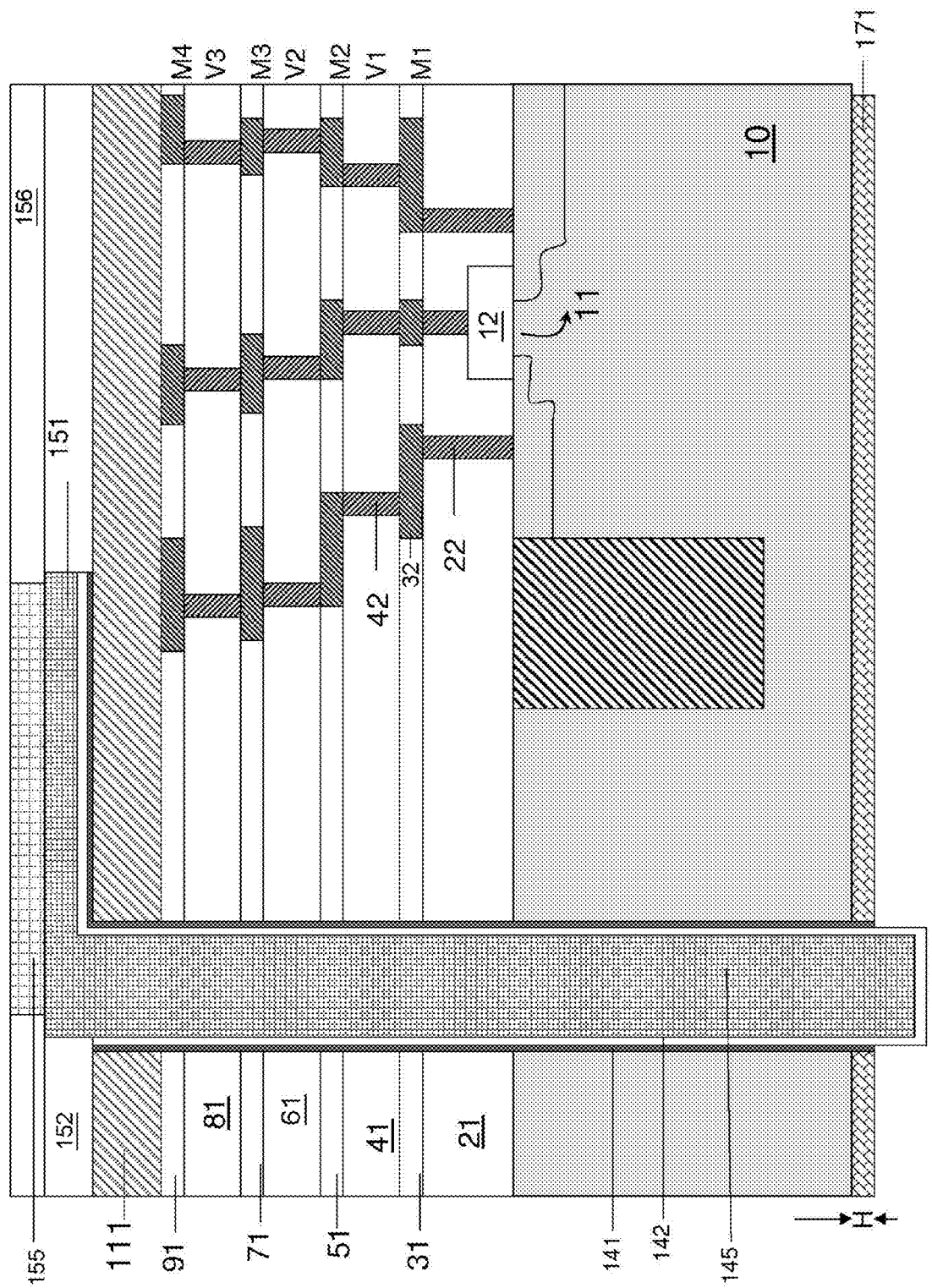

Referring next to FIG. 1*j*, a resist layer 171 is coated, for example, using a spin on coating process. The resist layer 171 forms a thin layer and covers a first portion of the insulating liner 141 and trench liner 142. The thickness of the resist layer 171 can be controlled to a second distance H. The use of the resist layer 171 enables an accurate control of this second distance H and hence the subsequently formed TSV sidewall spacer. The resist layer 171 is selected such that a suitable wet etchant may be used to etch the exposed portion of the insulating liner 141, without significantly etching the organic layer 171. In various embodiments, the resist layer 171 comprises a material such as a photo resist material or other suitable materials such as bottom antireflective coating, low k dielectrics, extreme low k dielectrics, or porous insulator materials.

Referring again to FIG. 1i, the exposed insulating liner 141 is etched using a wet etch process. In one embodiment, the insulating liner 141 is removed using a wet etch chemistry comprising buffered HF ($NH_4F$:HF). The wet etch chemistry is selected such that the insulating liner 141 is etched without removing the resist layer 171.

Figure 1K:
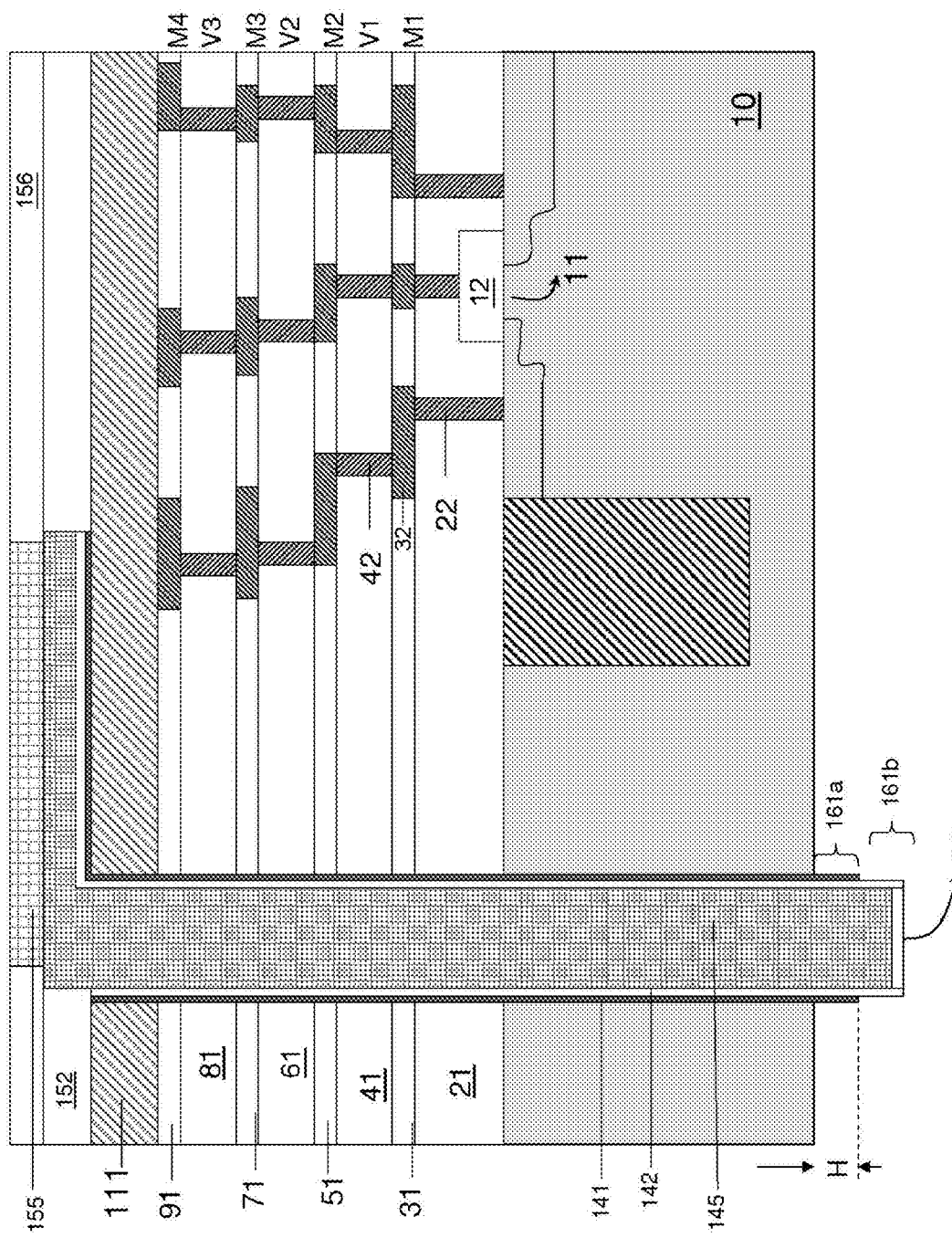

As shown in FIG. 1k, the resist layer 171 is removed subsequently forming a first portion of the protrusion 161a and a second portion of the protrusion 161b. The first portion of the protrusion 161a includes the insulating liner 141 and hence forms a protected TSV sidewall spacer. The protected TSV sidewall spacer is an advantage of an embodiment, in that the conductive fill material 145 is protected from oxidation by the un-etched isolation liner 141, thus eliminating a cause of current leakage. It also minimizes any shorting from the protruding TSV 50 to the substrate 10 during subsequent processing. Further, the thickness of the sidewall spacer (height of the first portion of the protrusion 161a) is tightly controlled as the coating process to deposit the resist layer 171 and the etching rates of the resist layer 171 are well characterized. The thickness of the resist layer 171 primarily determines the height of the sidewall spacer and being a coating process can be controlled well.

Figure 1L:
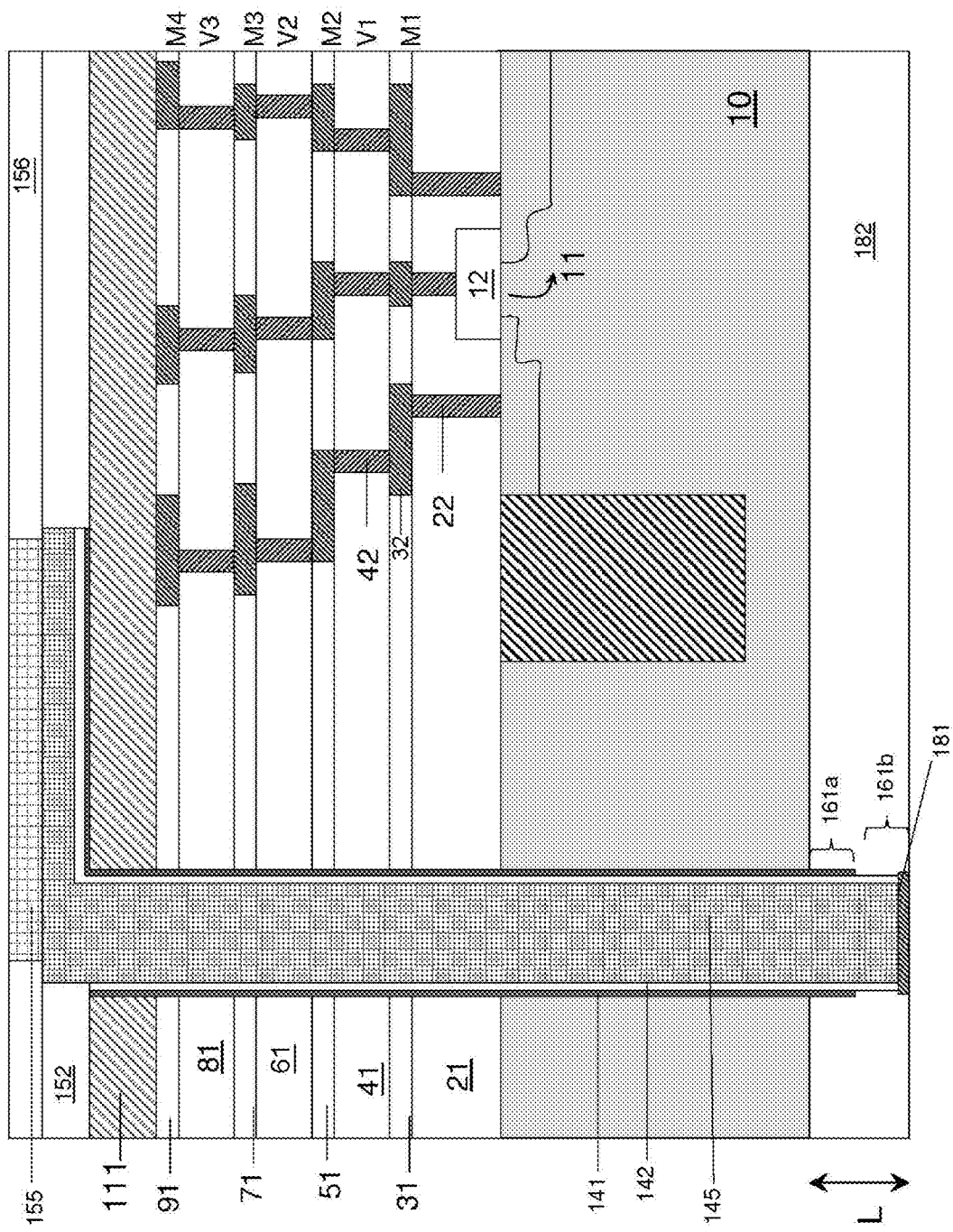

Turning to FIG. 1l, the substrate 10 may be diced at this step, although optionally in some embodiments, the substrate is diced at a later stage. The second portion of the protrusion 161b of the protruding TSV 50 is electro-plated with a wetting layer 181, for example, an electroless nickel/gold layer or other metal finish process. The wetting layer 181 is not formed on the insulating liner 141 of the first portion of the protrusion 161a. Thus, shorting of the wetting layer 181 to the substrate 10 is advantageously avoided. The wetting layer 181 protects the underlying nickel and conductive fill material 145 from oxidation. The nickel is used as a wetting agent during subsequent solder formation. Thus, the protruding TSV 50 is substantially protected from oxidation by either the insulating liner 145 or the wetting layer 181. The substrate 10 is next coated with an under-fill layer 182. The under-fill layer 182 may comprise a polymer, for example. There are several types of under-fill materials with differing properties relative to thermal transfer and mechanical properties. All under-fill materials are within the scope of these embodiments.

Figure 1M:
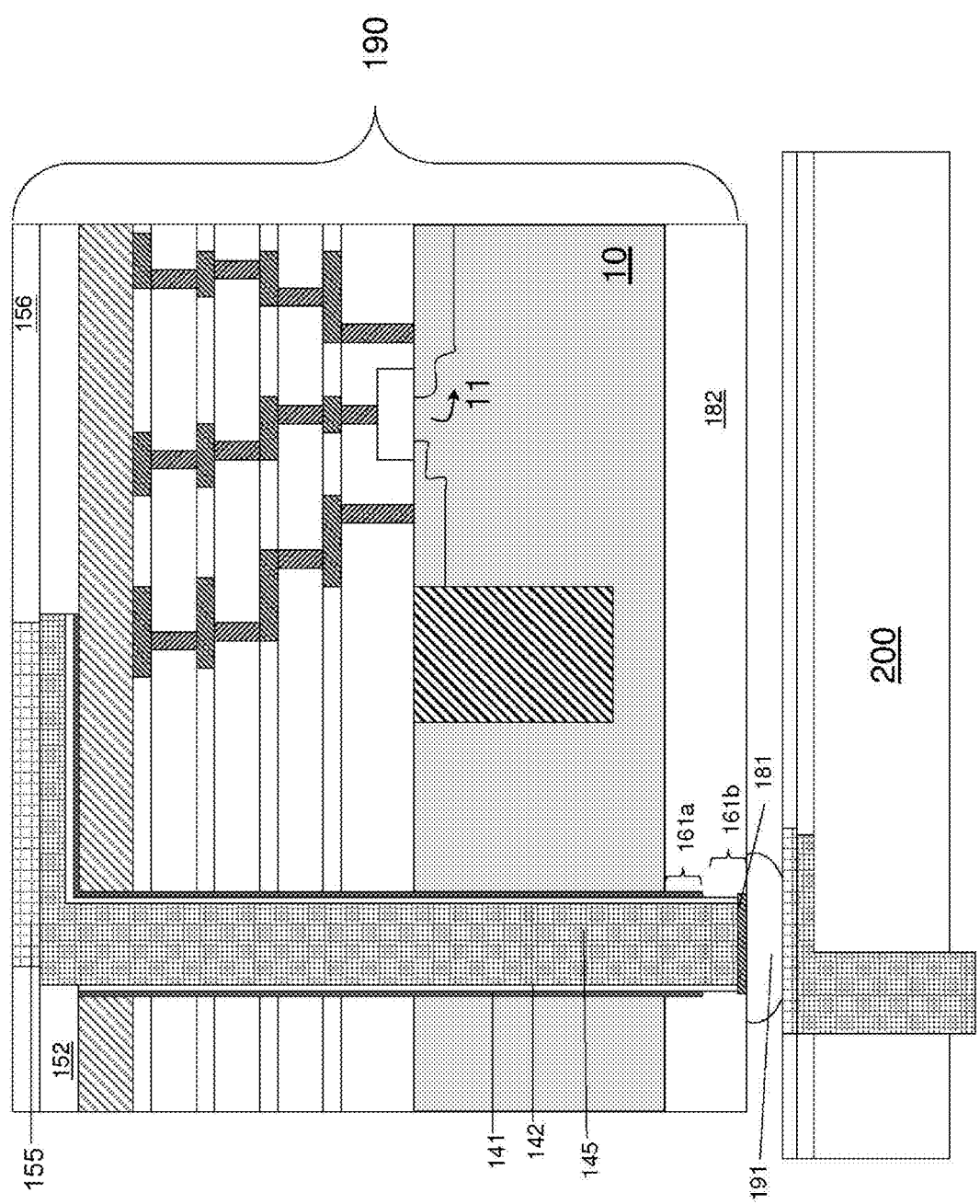

Referring to FIG. 1m, a die 200 is bonded to the TSV 50 of the diced substrate 190 using a bonding reflow process. Solder balls 191 bonds the die 200 to the substrate 10 by bonding a UMB structure 155 of the die 200 to the protruding part of the TSV 50 of the substrate 10. The bonding process may be accomplished by thermal, thermosonic compression, or the like. The substrate may be processed further with processes known by those of ordinary skill in the art or the process may then end.

FIG. 2, which includes FIGS. 2a-2e, illustrates a stacked integrated chip comprising through substrate via during fabrication, in accordance with an embodiment of the invention.

Figure 2A:
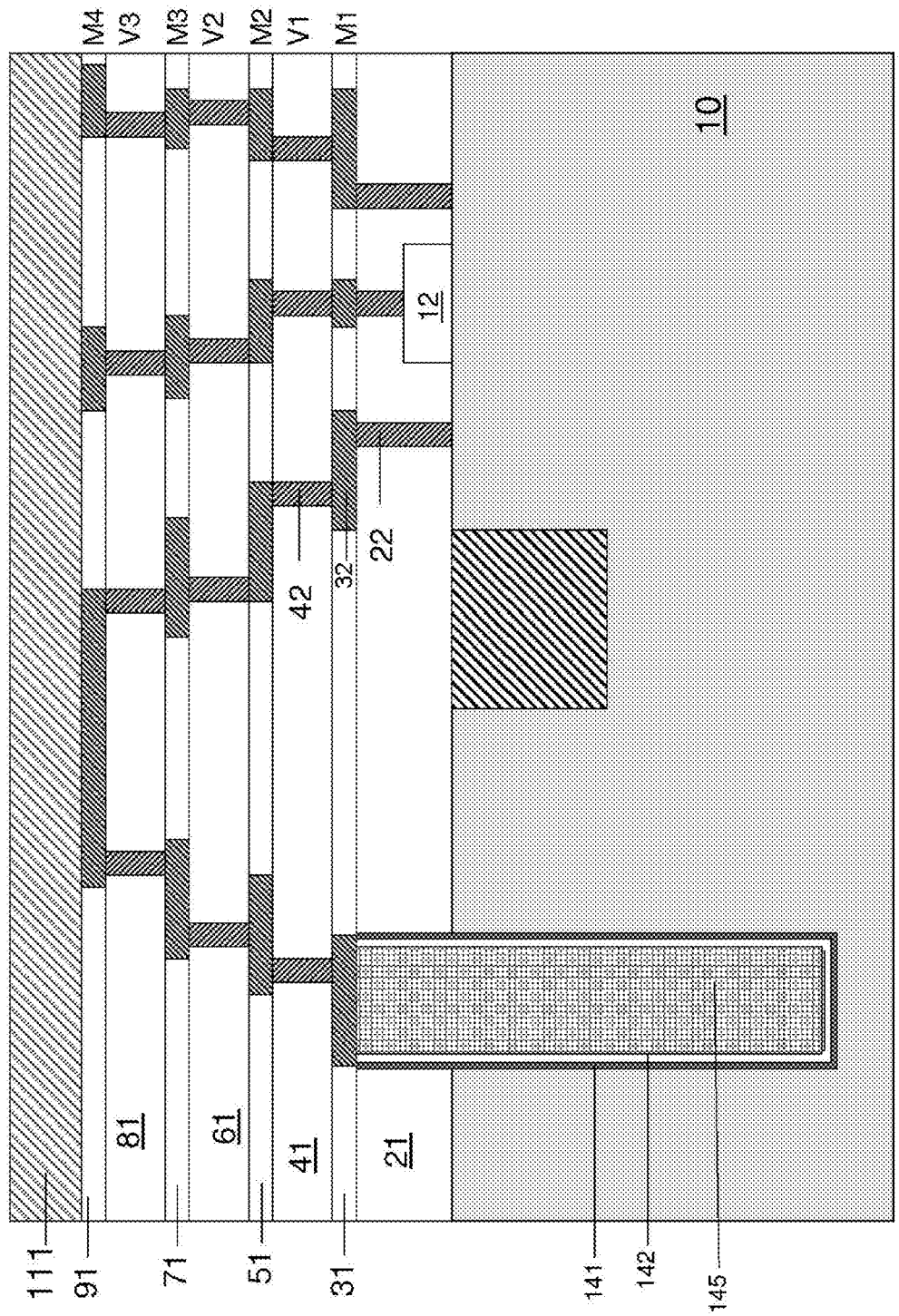
FIGS. 2a-2e, illustrates a stacked integrated chip comprising through substrate vias during fabrication, in accordance with an embodiment of the invention.

Referring to FIG. 2a, the protruding TSV 50 is formed by first lining an opening with an insulating liner 141, and a conductive trench liner 142 and filled with a conductive fill material 145 as described in prior embodiments.

Unlike the prior embodiment, the through substrate via extends only up to the first metal level. For example, in one embodiment, the TSV 50 is also coupled to the active transistors through the metallization levels. After completion of the last metal level a passivation layer 111 is deposited.

Figure 2B:
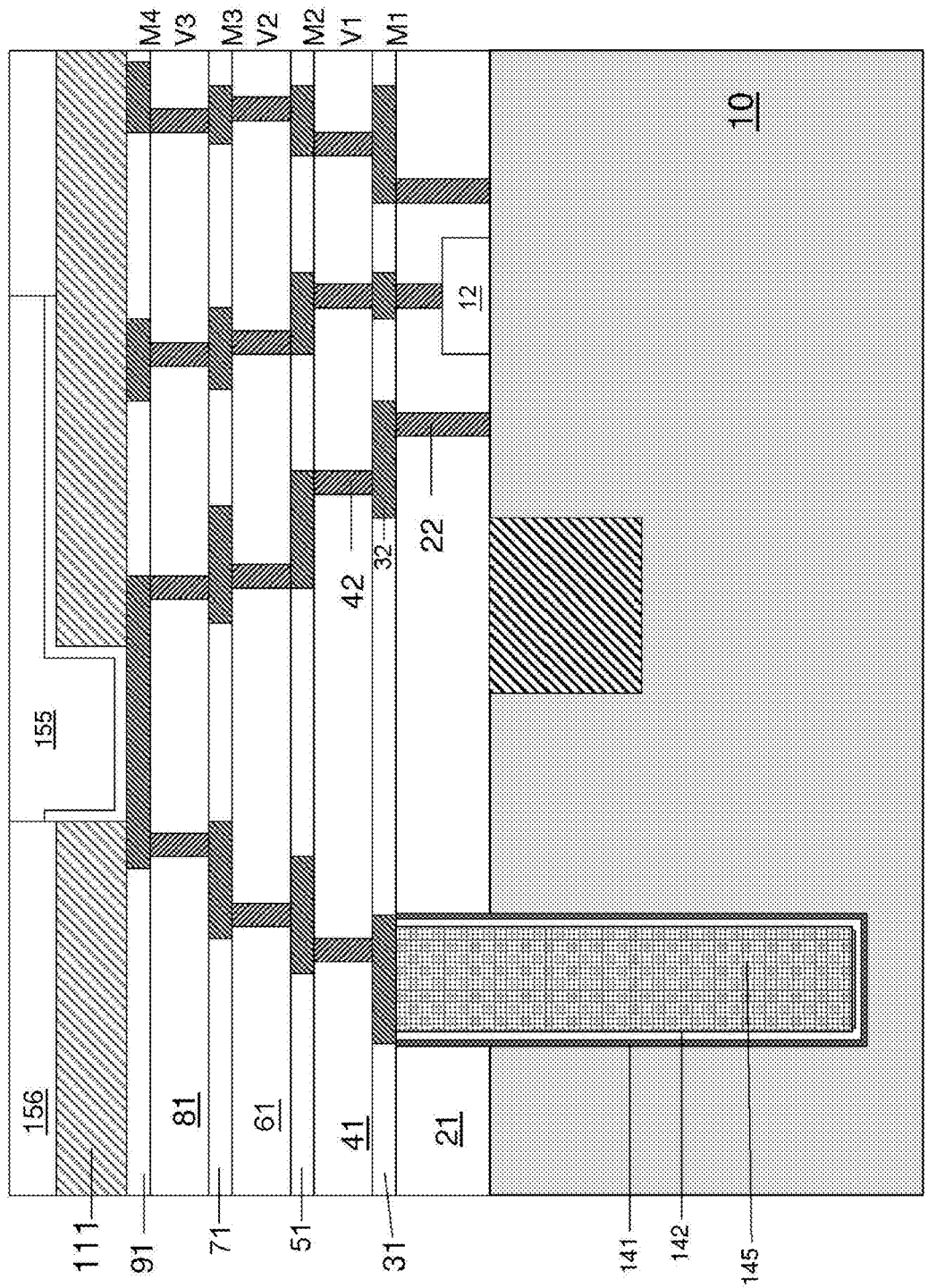

Referring to FIG. 2b, a photo resist is deposited over the passivation layer 111 and patterned to form an opening for conducting pads. A polyimide material 156, or the like, may then be deposited and patterned forming an UMB structure 155. The TSV 50 is coupled to the UMB structure 155 through the metallization levels.

Figure 2C:
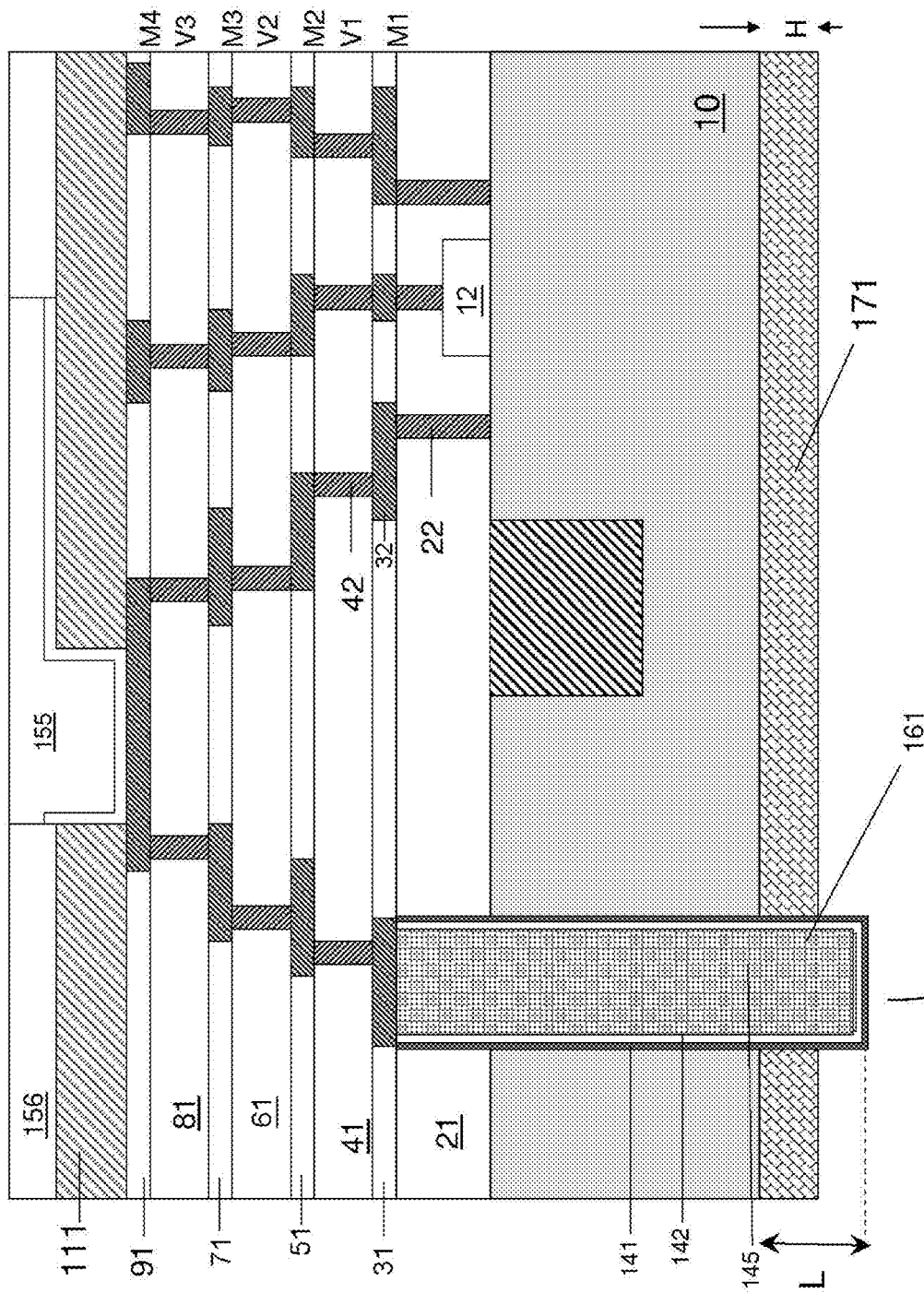
Figure 2D:
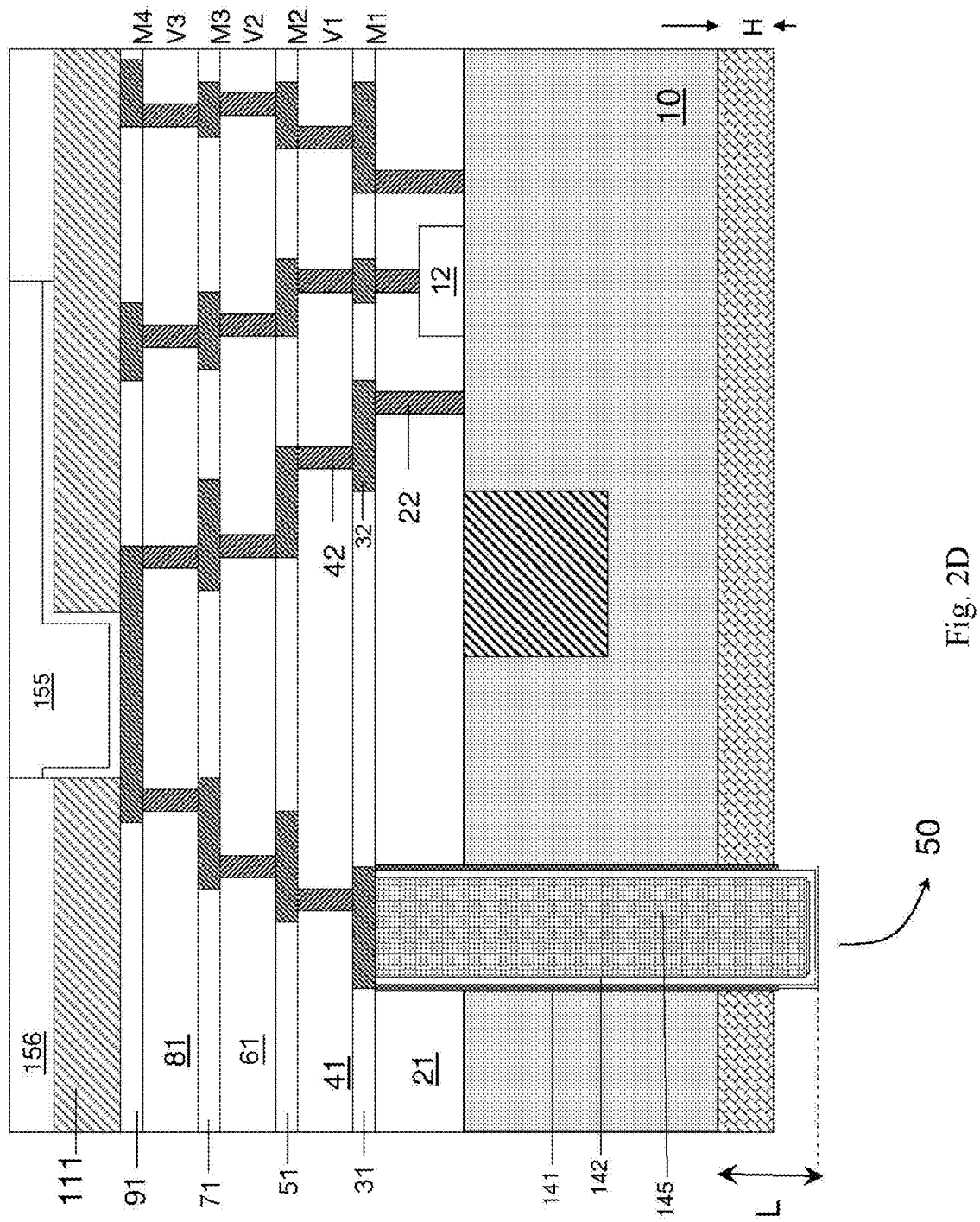

Referring next to FIG. 2c, the substrate 10 is flipped over and thinned to form a TSV 50 with a protrusion 161. A resist layer 171 is coated, for example, using a spin on coating process. The resist layer 171 forms a thin layer and covers a first portion of the insulating liner 141 and trench liner 142. The thickness of the resist layer 171 is controlled to a second distance D. Referring to FIG. 2d, the exposed insulating liner 141 is etched using a wet etch process such that the insulating liner 141 is etched without removing the resist layer 171.

Figure 2E:
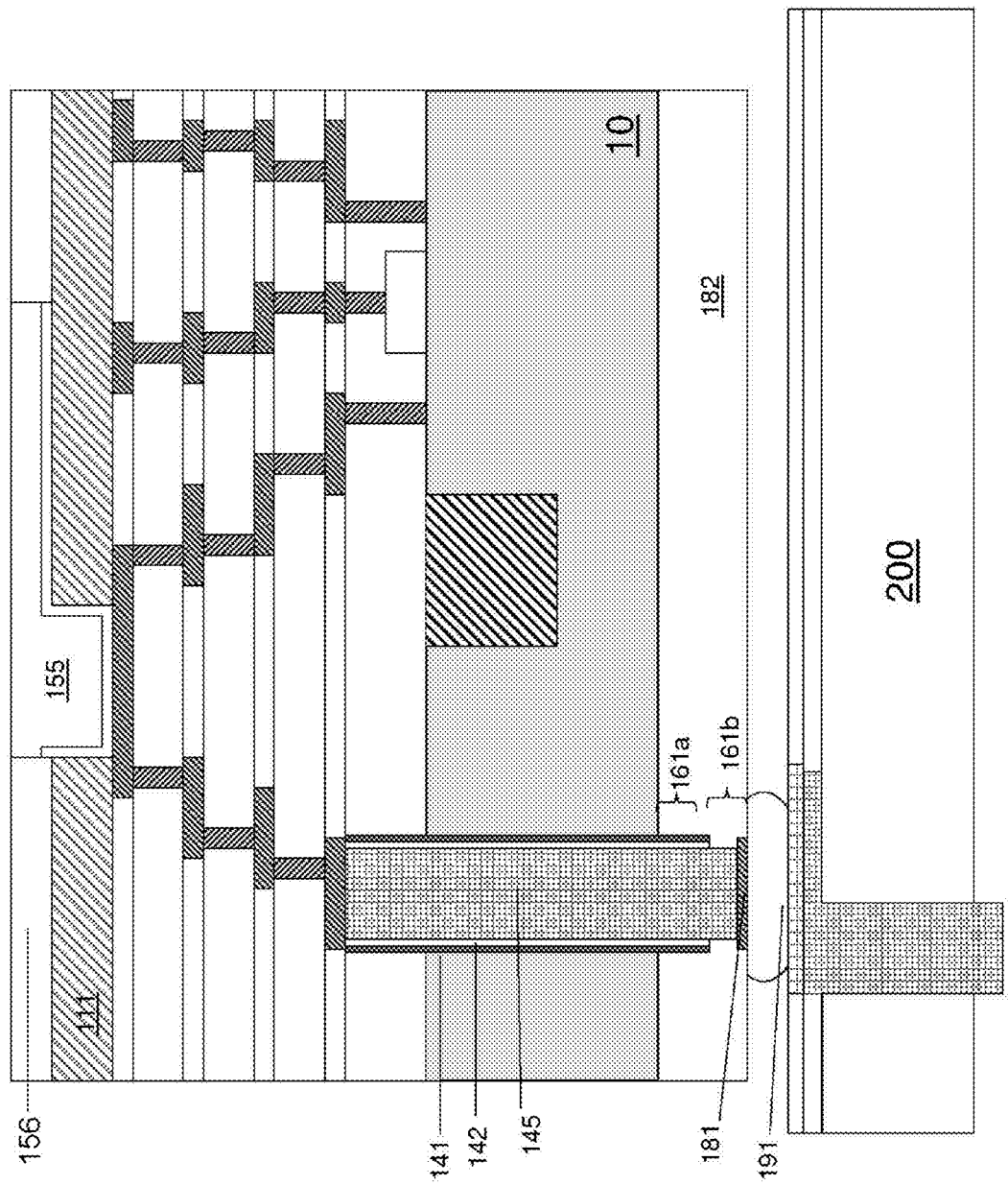

As next shown in FIG. 2e, the resist layer 171 is removed forming a first portion of the protrusion 161a and a second portion of the protrusion 161b. The first portion of the protrusion 161a includes the insulating liner 141 and hence forms a protected TSV sidewall spacer. The substrate 10 is coated with a wetting layer 181 and soldered using solder balls 191 to a die 200.

While in this embodiment, the TSV 50 extends from a bottom surface of the substrate 10 to the first metal line level M1, in other embodiments, the TSV 50 may extend up to any metallization level or may extend only up to the top surface of the substrate 10.

Figure 3A:
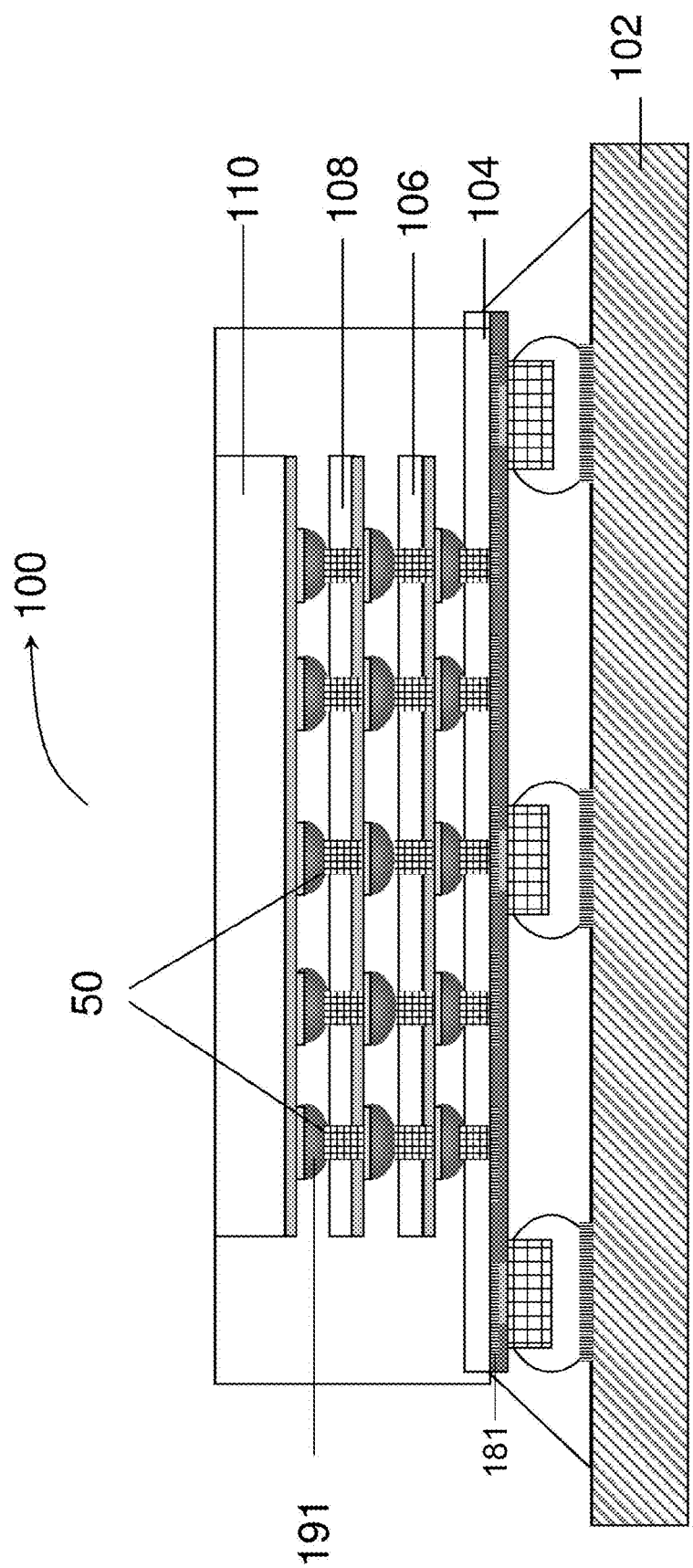

FIG. 3, which includes FIGS. 3a and 3b, illustrates a stacked integrated circuit formed using embodiments of the invention. Referring to FIG. 3a, a stacked integrated chip 100 comprises a first chip 102, a second chip 104, a third chip 106, a fourth chip 108, and a fifth chip 110. The first, second, third, fourth, and fifth chips 102, 104, 106, 108, and 110 may comprise silicon or other semiconductor materials, for example. Further, substrates, such as the first chip 102, may be comprised of non-semiconductor materials, such as bismaleimide triazine (BT), or the like. The first, second, third, fourth, and fifth chips 102, 104, 106, 108, and 110 comprise any suitable type of chips including memory, logic, analog, or combinations thereof.

The first, second, third, fourth, and fifth chips 102-110 may include one or more conductive layers. There may be multiple metallization layers formed within chips 102-110, for example, and the first, second, third, fourth, and fifth chips 102-110 may include a plurality of other layers such as inter-poly oxide (IPO) or inter-metal dielectric (IMD) layers (not shown). The first, second, third, fourth, and fifth chips 102-110 may also include other active components or circuits. Further, the stacked integrated chip 100 may include additional chips therein (also not shown).

Any or all of first, second, third, fourth, and fifth chips 102-110 may comprise TSVs 50. The TSVs 50 protrude from a first side of a substrate. The TSVs 50 provide an electrical connection between the first side and a second side of a substrate. At least one of the TSVs 50 in the first, second, third, fourth, and fifth chips 102-110 comprises a sidewall spacer formed in accordance with embodiments described in FIGS. 1 and 2.

FIG. 3b illustrates the third chip 106 showing the sidewall spacer. The protruding TSV 50 comprises a protrusion 161 comprising a first portion of the protrusion 161a and a second portion of the protrusion 161b. The first portion of the protrusion 161a includes the insulating liner 141 and hence forms a protected TSV sidewall spacer. The second portion of the protrusion 161b is in contact with a wetting layer 181 and coupled to the first chip 102 through the solder ball 191. The protrusion 161 is encapsulated in an under-fill layer 182 such as a polymer material layer.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor chip, the method comprising:
    forming an opening for a through substrate via from a top surface of a first substrate;
    lining sidewalls of the opening with an insulating liner;
    filling the opening with a conductive fill material;
    etching the first substrate from an opposite bottom surface to form a protrusion, the protrusion being covered with the insulating liner;
    depositing a resist layer around the protrusion to expose a portion of the insulating liner;
    etching the exposed insulating liner to form a sidewall spacer along the protrusion; and
    replacing the resist layer with an under-fill layer, the under-fill layer directly adjoining the sidewall spacer.

2. The method of claim 1, wherein a thickness of the resist layer is thinner than a height of the protrusion, and wherein a height of the sidewall spacer along the protrusion is about the same as the thickness of the resist layer.

3. The method of claim 1, wherein a height of the sidewall spacer along the protrusion is less than a height of the protrusion.

4. The method of claim 1, further comprising:
    flipping the first substrate after filling the opening with the conductive fill material; and
    removing the resist layer after etching the exposed insulating liner.

5. The method of claim 1, wherein the first substrate comprises a semiconductor wafer comprising active circuitry on the top surface, and wherein the opening extends from the top surface to a lower surface disposed within the first substrate.

6. The method of claim 1, wherein etching the insulating liner comprises using a wet etch chemistry to remove the insulating liner without removing the resist layer.

7. The method of claim 1, wherein the insulating liner comprises a material selected from the group consisting of silicon oxide, silicon nitride, silicon oxynitride, SiC, SiCN, a low k dielectric material, a ultra low k dielectric material, and combinations thereof, wherein the conductive fill material comprises a material selected from the group consisting of copper, aluminum, tungsten, silver, gold, doped polysilicon, and combinations thereof, and wherein the resist layer comprises a photo resist or an antireflective coating material.

8. The method of claim 1, further comprising:
    forming a wetting layer on the conductive fill material of the protrusion; and
    forming a solder ball joint to electrically couple active circuitry on the first substrate to active circuitry on a second substrate.

9. The method of claim 8, wherein the wetting layer comprises a nickel/gold layer formed using an electroless plating process.

10. A method of forming a semiconductor chip, the method comprising:
    forming an opening for a through substrate via from a top side of a first substrate;
    lining sidewalls of the opening with an insulating liner;
    filling the opening with a conductive fill material;
    etching the first substrate from an opposite bottom side to expose a portion of the insulating liner disposed on the sidewalls of the opening;
    depositing a resist layer from the bottom side to expose a region of the exposed insulating liner;
    etching the region of the exposed insulating liner;
    after the etching the region of the exposed insulating liner, removing the resist layer to expose sidewalls of the insulating liner; and
    depositing a polymer layer on the bottom side, the polymer layer directly adjoining the exposed sidewalls of the insulating liner and directly adjoining exposed sidewalls of the conductive fill material.

11. The method of claim 10, further comprising:
    forming a wetting layer on the conductive fill material from the bottom side, wherein the wetting layer comprises forming a nickel/gold layer formed using an electroless plating process; and
    forming a solder ball joint to electrically couple active circuitry on the first substrate to active circuitry on a second substrate.

12. The method of claim 10, wherein the opening extends from the top side to a lower surface disposed within the first substrate.

13. The method of claim 10, wherein etching the region of the exposed insulating liner comprises using a wet etch chemistry to remove the insulating liner without removing the resist layer.

14. The method of claim 10, wherein the insulating liner comprises a material selected from the group consisting of silicon oxide, silicon nitride, silicon oxynitride, SiC, SiCN, a low k dielectric material, a ultra low k dielectric material, and combinations thereof, wherein the conductive fill material comprises a material selected from the group consisting of copper, aluminum, tungsten, silver, gold, doped polysilicon, and combinations thereof, and wherein the resist layer comprises a photo resist or an antireflective coating material.

15. A method of forming a semiconductor chip, the method comprising:
    forming an opening for a through substrate via from a top surface of a first substrate;
    lining sidewalls of the opening with an insulating liner;
    filling the opening with a conductive fill material;

etching the first substrate from an opposite bottom surface to expose a portion of the insulating liner;

depositing a resist layer around the exposed portion of the insulating liner;

forming a sidewall spacer on the conductive fill material on a first part of the exposed portion of the insulating liner by removing the remaining part of the exposed portion of the insulating liner using a wet etch process; and replacing the resist layer with an under-fill layer, the under-fill layer contacting a sidewall of the sidewall spacer and contacting a sidewall of the conductive fill material.

16. The method of claim 15, further comprising removing the resist layer after removing the remaining part of the exposed portion of the insulating liner.

17. The method of claim 15, further comprising:

forming a wetting layer on the conductive fill material adjacent the sidewall spacer, wherein the wetting layer comprises forming a nickel/gold layer formed using an electroless plating process; and forming a solder ball joint to electrically couple active circuitry on the first substrate to active circuitry on a second substrate.

18. The method of claim 15, wherein the opening extends from the top surface to a lower surface disposed within the first substrate.

19. The method of claim 15, wherein etching the region of the exposed insulating liner comprises using a wet etch chemistry to remove the insulating liner without removing the resist layer.

20. The method of claim 15, wherein the insulating liner comprises a material selected from the group consisting of silicon oxide, silicon nitride, silicon oxynitride, SiC, SiCN, a low k dielectric material, a ultra low k dielectric material, and combinations thereof, wherein the conductive fill material comprises a material selected from the group consisting of copper, aluminum, tungsten, silver, gold, doped polysilicon, and combinations thereof, and wherein the resist layer comprises a photo resist or an antireflective coating material.

* * * * *